(12) United States Patent
Yu et al.

(10) Patent No.: US 7,732,109 B2
(45) Date of Patent: Jun. 8, 2010

(54) METHOD AND SYSTEM FOR IMPROVING CRITICAL DIMENSION UNIFORMITY

(75) Inventors: Shinn-Sheng Yu, Hsinchu (TW); Chih-Ming Ke, Hsin-Chu (TW); Jacky Huang, Chu-Bei (TW); Chun-Kuang Chen, Hsin-Chu Hsien (TW); Tsai-Sheng Gau, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 667 days.

(21) Appl. No.: 11/696,602

(22) Filed: Apr. 4, 2007

(65) Prior Publication Data

US 2008/0248403 A1    Oct. 9, 2008

(51) Int. Cl.
*G03F 9/00* (2006.01)
*G03B 27/54* (2006.01)
*G03B 27/52* (2006.01)

(52) U.S. Cl. .................... 430/30; 430/394; 355/53; 355/55; 355/67; 356/394; 716/19; 716/21

(58) Field of Classification Search .................. 430/30, 430/394; 355/53, 55, 67; 356/394; 716/19, 716/21

See application file for complete search history.

(56) References Cited

U.S. PATENT DOCUMENTS

| 6,869,739 | B1 * | 3/2005 | Ausschnitt et al. | ............ 430/30 |
| 7,580,129 | B2 * | 8/2009 | Yu et al. | .................... 356/394 |

OTHER PUBLICATIONS

Hideki Ina et al., "Focus and Dose Measurement Method in Volume Production," Japanese Journal of Applied Physics, vol. 44, No. 7B, 2005, pp. 5520-5525.

* cited by examiner

*Primary Examiner*—Christopher G Young
(74) *Attorney, Agent, or Firm*—Haynes and Boone, LLP

(57) ABSTRACT

A method for improving critical dimension uniformity of a wafer includes exposing a plurality of mask patterns on a first plurality of substrates at predetermined locations with common splits conditions of focus and exposure dose for each of the first plurality of substrates to form a plurality of perturbed wafers; measuring a critical dimension of the plurality of mask patterns at each of the predetermined locations for each of the plurality of perturbed wafers; averaging the critical dimension measured at each of the predetermined locations over the plurality of perturbed wafers to form a perturbed critical dimension map; measuring a sidewall angle of the plurality of mask patterns; averaging the sidewall angle measured to form a perturbed sidewall angle map; and providing the perturbed critical dimension map and the perturbed sidewall angle map to an exposure tool.

21 Claims, 4 Drawing Sheets

METHOD AND SYSTEM FOR IMPROVING CRITICAL DIMENSION UNIFORMITY

BACKGROUND

The present disclosure relates in general to semiconductor manufacturing technology, and more particularly, to a method and system for improving critical dimension uniformity in a semiconductor wafer.

As the critical dimensions of semiconductor devices become smaller and smaller, the resolution of the exposure tool used to create the device becomes a more important consideration for manufacture. One way to increase the resolution is to reduce the exposure wavelength. However, reducing the exposure wavelength results in a relatively high manufacturing cost due to changes needed for masks, lenses, and resists. Another way to increase the resolution is to increase the numerical aperture of the projection lens used in the exposure tool. However, one side effect of increasing the numerical aperture of the projection lens is that the depth of focus becomes smaller as the numerical aperture becomes higher. Thus, the focus of the exposure tool becomes an important issue to control.

In order to control the focus, the focus must first be correctly determined. One method for determining focus is the introduction of phase-shift mask monitors, which includes adding a phase shifter adjacent to overlaying marks and measuring a defocus-induced image displacement on an overlay metrology tool. In addition to phase-shifters, phase grating may be used to further enhance the focus sensitivity. While these methods provide focus monitoring, special mask types are required to achieve a desired specific imaging property. Thus, it is costly to use these techniques in a production environment.

A need exists for a method and system that provides a model-based focus monitoring technique from within the process tool which reflects true production process conditions regardless of mask types.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
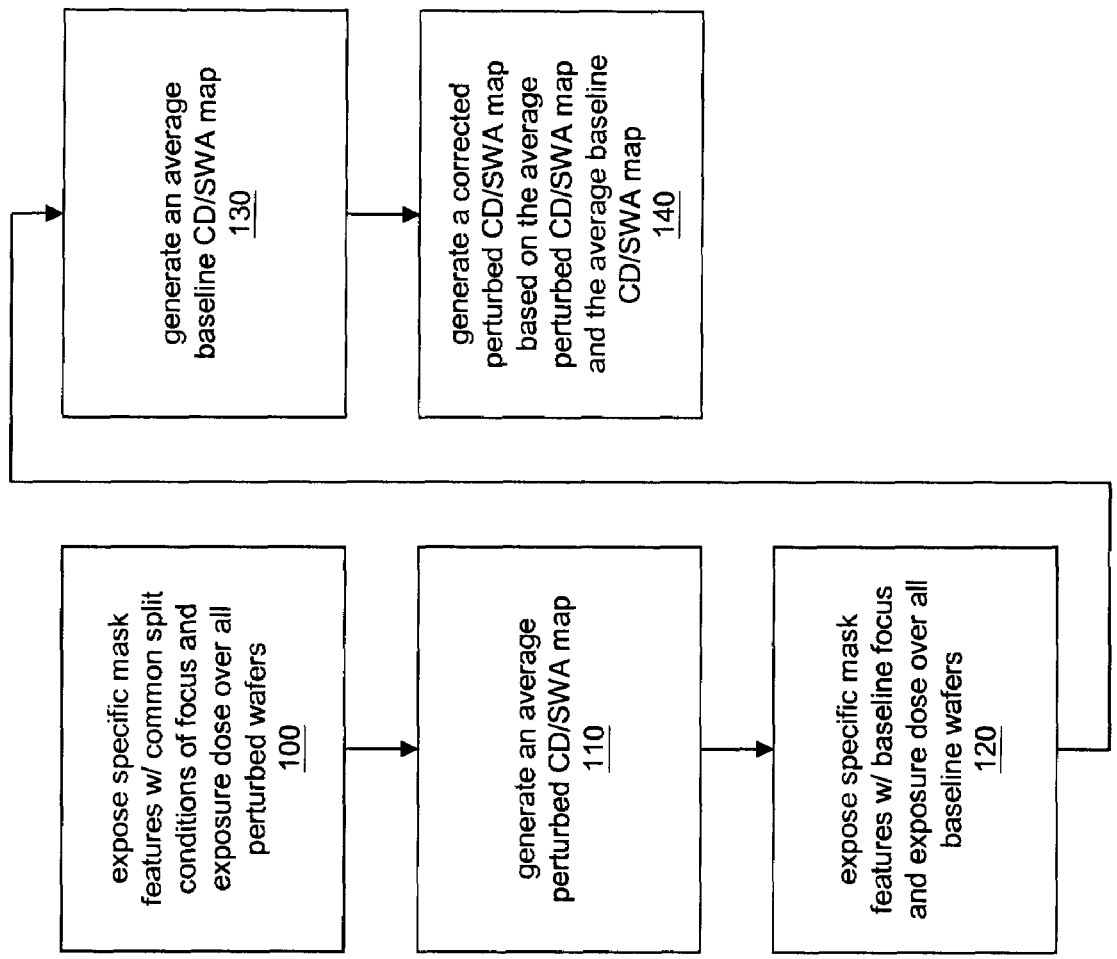
FIG. 1 is a flowchart of an exemplary process for collecting data for establishing a model for determining accurately the actual focus and exposure dose applied to an exposed pattern on a wafer by eliminating systematic and random errors of focus and exposure dose.

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

In integrated circuit manufacturing technology, a resist layer (photoresist) is typically applied to a semiconductor wafer surface, followed by an exposure of the resist through a mask (also referred to as a reticle or photomask). A post-exposure bake is then performed to initiate the de-protection reaction, which makes the chemically amplified resist in the exposed area more soluble in the developer (for positive-tone resist) and thus will be developed away in the subsequent development process. An after-development inspection (ADI) is then performed to inspect the critical dimension (CD) and profile of the exposed resist using a scanning electron microscope (SEM) to check whether it conforms to a specification. If the resist is within specification, a pattern is etched or transferred and the resist is stripped. An after-etching inspection (AEI) is then performed on the wafer.

Traditional SEM inspection, however, becomes a bottleneck for providing accurate and repeatable CD due to the inherent edge roughness of the resist pattern and the ArF resist being easily damaged by the e-beam. In response, a scatterometry-based optical critical dimension metrology (OCD) is used instead of SEM inspection. The benefit of OCD is that it provides a nearly non-demolition measurement of a resist pattern. More, OCD is impervious to the edge roughness of the resist pattern. Further, OCD can determine such information of the resist pattern as CD and profile (manifested as side-wall angle (SWA)) as well as thickness of each thin film on the wafer. Thus, OCD provides more consistent and comprehensive information of the resist pattern than SEM.

Since SWA is sensitive to focus, it can be employed for the purpose of focus monitoring or focus control. Unlike CD, SWA is a monotonic function of focus. Thus, the direction of focus can be uniquely determined from the measured SWA. Since CD and SWA can be directly determined from resist patterns on production wafers, regardless of the type of the mask employed to fabricate them, focus monitoring or focus control by employing CD and SWA measured directly from production wafers can be realized.

However, similar to CD, SWA is also sensitive to exposure dose. So, despite that SWA is a monotonic function of focus, SWA alone cannot determine the value of focus accurately. In fact, we need to know both CD and SWA to determine focus along with exposure dose. Since CD and SWA can be measured directly from resist patterns on production wafers, regardless of the type of the mask that produces them, in-line focus monitoring or focus control can be realized. Aspects of the present disclosure provide a model-based approach for determining focus and exposure dose based on measured CD and SWA. In addition, the aspects of the present disclosure isolate focus errors from errors of exposure dose.

Referring to FIG. 1, an exemplary procedure for setting up a model, which establish the relationship of CD and SWA as functions of both focus and exposure dose, begins at step 100 to expose perturbed wafers with common split conditions of focus $\{F_j\}_{j=1,NF}$ (NF is the number of splits of focus) and exposure dose $\{E_k\}_{k=1,NE}$ (NE is the number of splits of exposure dose) for each wafer, as shown in FIG. 1. The process proceeds to step 110 to generate a perturbed CD/SWA map by averaging the values of CD/SWA at the same within-wafer location over all perturbed wafers. The process proceeds to step 120 to expose baseline wafers with the same baseline conditions of focus and exposure dose for each wafer. The process proceeds to step 130 to generate a baseline CD/SWA map by averaging the values of CD/SWA at the same within-wafer location over all baseline wafers. The process proceeds to step 140 to generate a corrected perturbed CD/SWA map by subtracting the baseline CD/SWA map from the perturbed CD/SWA map.

In order to control critical dimension to achieve good critical dimension uniformity, determination of actual focus and exposure dose applied to each exposed pattern is essential to provide feedback correction for subsequent wafers in the fabrication process. However, determination of such actual focus and exposure dose may not be easy, since both CD and SWA depend on both focus and exposure dose. Aspects of the present disclosure provide a method for determining actual focus and exposure dose by solving simultaneous equations.

Figure 2:
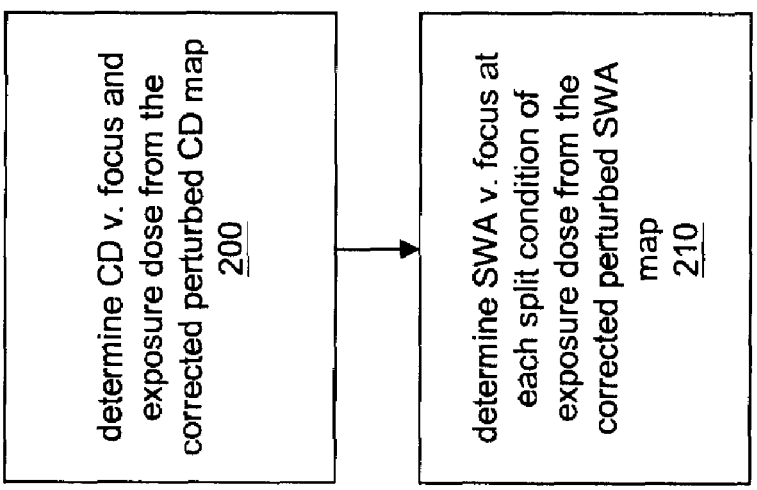
FIG. 2 is a flowchart of an exemplary process for establishing a model, which expresses CD and SWA in terms of focus and exposure dose.

To solve for actual focus and exposure dose, CD and SWA are first expressed as functions of focus and exposure dose. Referring to FIG. 2, an exemplary procedure for expressing CD and SWA in terms of focus and exposure dose begins at step 200 to determine CD v. focus and exposure dose by using the corrected perturbed CD map. For example, for each of the splits of exposure dose $(E_k)$, CD (W) v. focus $(F_j)$ is expressed in terms of a second order polynomial as illustrated in equation (1):

$$W = a_k(F-f_k)^2 + g_k, \quad (1)$$

where $a_k$, $f_k$, and $g_k$ are constants, F is a variable of $F_j$.

In one embodiment, by fitting all $\{E_k, a_k\}$ pairs in a first-order polynomial, $a_k$ may be expressed as a function of exposure dose $(E_k)$ as illustrated in equation (2):

$$a = a_0 + a_1 E, \quad (2)$$

where $a_0$ and $a_1$ are all constants, a and E are variables for $a_k$ and $E_k$, respectively.

In addition, by fitting all $\{E_k, f_k\}$ pairs in a zero-order polynomial, $f_k$ may be expressed as a function of exposure dose $(E_k)$ as illustrated in equation (3):

$$f = f_0, \quad (3)$$

where $f_0$ is a constant, f is a variable of $f_k$.

Also, by fitting all $\{E_k, g_k\}$ pairs in a first-order polynomial, gk may be expressed as a function of exposure dose $(E_k)$ as illustrated in equation (4):

$$g = g_0 + g_1 E, \quad (4)$$

where $g_0$ and $g_1$ are constants, g and E are variables of $g_k$ and $E_k$, respectively.

Thus, CD as a function of focus and exposure dose is formulated as shown in equation (5):

$$W = (a_0 + a_1 E)(F - f_0)^2 + g_0 + g_1 E. \quad (5)$$

The procedure then proceeds to step 210 to determine SWA v. focus and exposure dose by using the corrected perturbed SWA map. For example, for each of the splits of exposure dose $(E_k)$, SWA (U) v. focus $(F_j)$ is expressed in terms of a third-order polynomial as illustrated in equation (6):

$$U = b_{0,k} + b_{1,k}F + b_{2,k}F^2 + b_{3,k}F^3, \quad (6)$$

where $b_{0,k}$, $b_{1,k}$, $b_{2,k}$, and $b_{3,k}$ are constants, and F is a variable for $F_j$.

Once CD/SWA v. focus and exposure dose are determined, the model is set up. The actual focus and exposure dose applied on a resist pattern at location $r_i$ within a production wafer can be solved with the model by substituting the measured CD $(W_i)$ and SWA $(U_i)$ of the resist pattern at location $r_i$.

Figure 3:
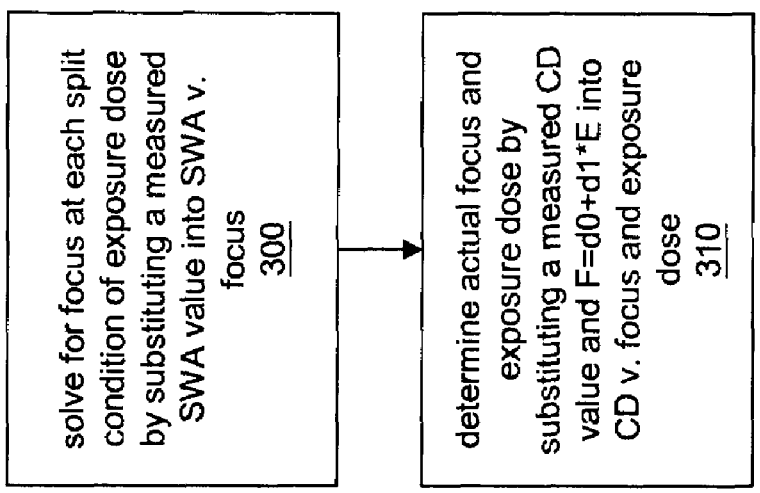
FIG. 3 is a flowchart of an exemplary process for solving the actual focus and exposure dose by employing the established model and the CD ($W_j$) and SWA ($U_j$) measured at each location $r_i$ within a production wafer.

Referring to FIG. 3, an exemplary procedure for solving actual focus and exposure dose for measured CD $(W_i)$ and SWA $(U_i)$ of a resist pattern at location $r_i$ within a production wafer begins at step 300 to solve for focus using SWA v. focus for each of the splits of exposure dose $(E_k)$ as illustrated in equation (6) to obtain $F_{i,k}$. Then, by fitting all $\{E_k, F_{i,k}\}$ pairs in a first-order polynomial, $F_{i,k}$ may be expressed as a function of exposure dose $(E_k)$ as illustrated in equation (7):

$$F = d_0 + d_1 E, \quad (7)$$

where $d_0$ and $d_1$ are constants, and F and E are variables of $F_{i,k}$ and $E_k$, respectively.

Once equation (7) is determined, the procedure continues to step 310 to determine actual focus and exposure dose by substituting the equation (7) into the CD v. focus and exposure dose as illustrated in equation (5) to obtain $E_i$ and $F_i$. One way to substitute equation (7) is to first express E in terms of F, which results in equation (8):

$$E = (-d_0 + F)/d_1. \quad (8)$$

Equation (8) is then substituted into equation (5), $W = (a_0 + a_1 E)(F - f_0)^2 + g_0 + g_1 E$, to obtain $F_i$. $E_i$ is then determined by substituting the value of $F_i$ into equation (8) to form equation (9):

$$E_i = (-d_0 + F_i)/d_1. \quad (9)$$

Another way to substitute equation (7) is by directly substituting equation (7) into equation (5) to obtain $E_i$. $F_i$ may then be solved by substituting the value of $E_i$ into equation (7) to form equation (10):

$$F_i = d_0 + d_1 E_i. \quad (10)$$

It is noted that by requiring focus and exposure dose to be real and in the range of the splits of focus and exposure dose employed for setting up the model, unique solution of $E_i$ and $F_i$ may be obtained.

Once actual focus and exposure dose are determined at some within-wafer location $r_i$, the stability of the semiconductor fabrication process is monitored by a statistical process control (SPC) system using actual focus and exposure dose. If the SPC system detects a systematic error during the process, a feedback correction may be performed by referring to actual focus and exposure dose.

Figure 4:
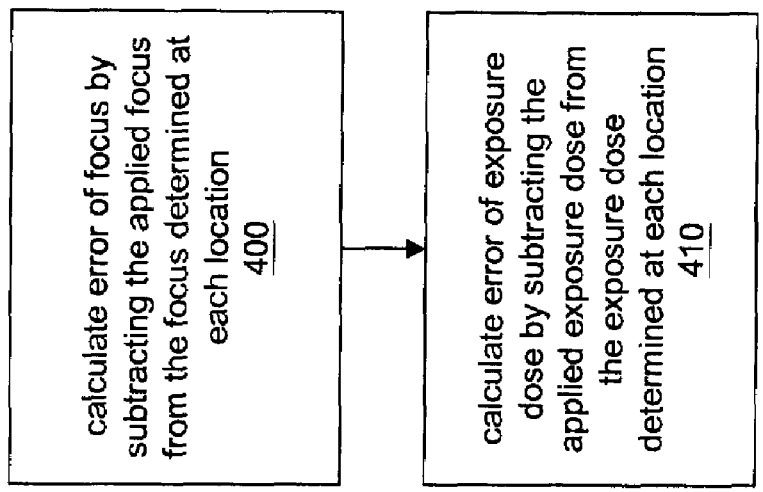
FIG. 4 is a flowchart of an exemplary process for calculating the error of focus and exposure dose at each intrafield location.

During monitoring of the semiconductor fabrication process, error of focus and exposure dose may be determined at some within-wafer location $r_i$. Error of focus and exposure dose may be calculated based on the deviation of actual focus and exposure dose from baseline focus and exposure dose at the same location. Referring to FIG. 4, an exemplary procedure for calculating error of focus and exposure dose at some within-wafer locations begins at step 400 to calculate error of focus by subtracting baseline focus from actual focus by using equation (11);

$$\Delta F_i = F_i - F_N, \quad (11)$$

where $F_i$ is the actual focus at location $r_i$ and $F_N$ is baseline focus.

The process continues to step 410 to calculate error of exposure dose by subtracting baseline exposure dose from actual exposure dose by using equation (12):

$$\Delta E_i = E_i - E_N, \quad (12)$$

where $E_i$ is the actual exposure dose at location $r_i$ and $E_N$ is baseline exposure dose.

At each within-wafer location $r_i$, feedback correction may be made to adjust focus and exposure dose in the exposure tool by $-\Delta F_i$ and $-\Delta E_i$, respectively. However, in semiconductor manufacturing, it may be impractical to correct the error focus and exposure dose for each sampled location within a wafer, since circuit patterns are exposed on the wafer field by field. The exposure tool may not be able to correct each location within a field individually, but rather all locations of a field as a whole.

Therefore, aspects of the present disclosure provide a method to determine the error of focus and exposure dose for each field of a wafer. The error of focus and exposure dose for each field may be calculated based on the deviation of average of all intrafield focus and exposure dose from baseline focus and exposure dose.

Figure 5:
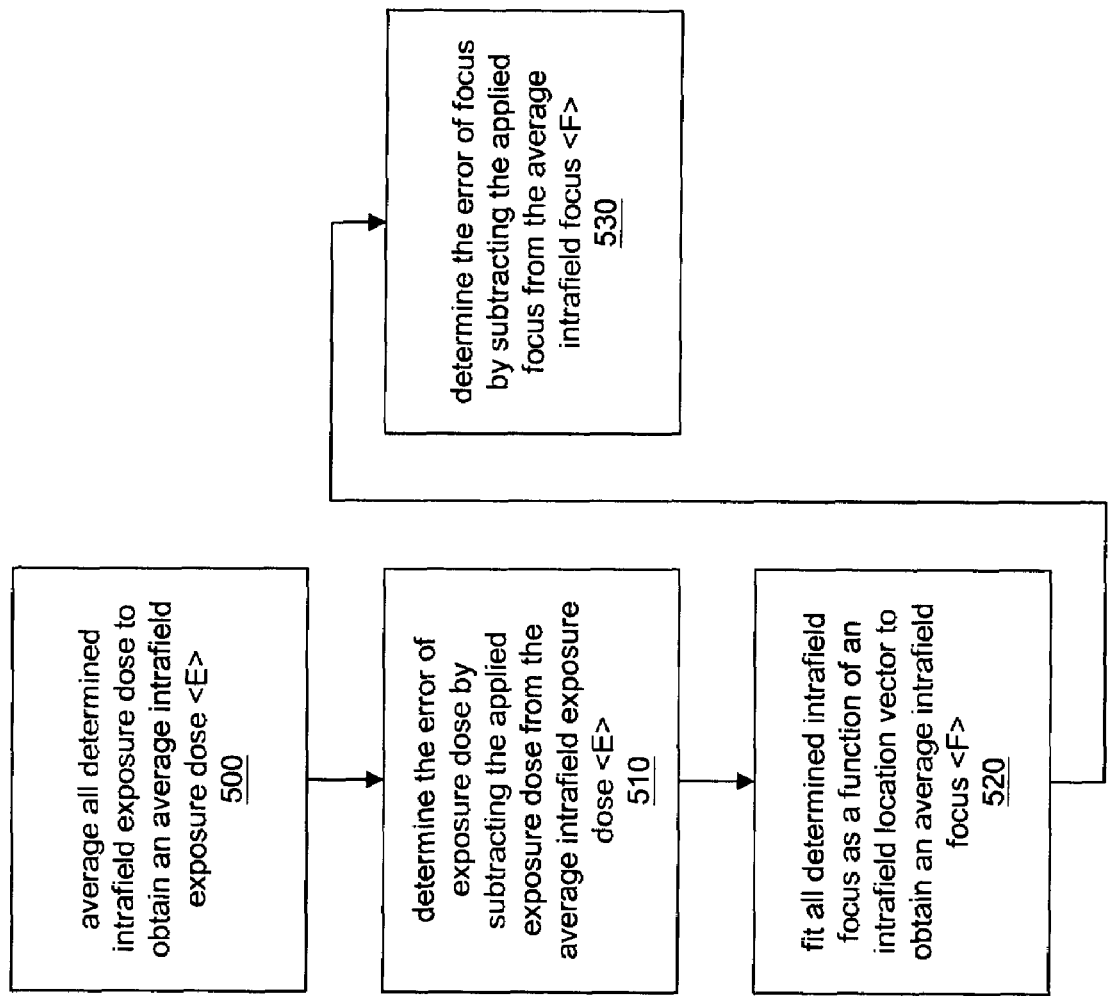
FIG. 5 is a flowchart of an exemplary process for calculating the average error of focus and exposure dose for each field.

Referring to FIG. 5, an exemplary procedure for calculating the error of focus and exposure dose for each field begins at step 500 to average all intrafield exposure dose Ei to obtain <E>. The procedure then continues to step 510 to determine the error of exposure dose of a field by subtracting baseline exposure dose from the average intrafield exposure dose of a field using equation (13):

$$\Delta E = \langle E \rangle - E_N, \quad (13)$$

where <E> is the average intrafield exposure dose and $E_N$ is baseline exposure dose As to error of focus for each field, the process continues to step 520 to fit all intrafield focus $F_i$ as a function of location vector $r_{i,A}$ to obtain intrafield focus F as illustrated in equation (14):

$$F = -R_y x_A + R_x y_A + \langle F \rangle, \quad (14)$$

wherein $x_A$, $y_A$, and F are variables for $x_{i,A}$, $y_{i,A}$, and $F_i$, respectively.

Location vector $r_{i,A}$ is described in terms of its components in Cartesian coordinates as $(x_{i,A}, y_{i,A})$. Location vector $r_{i,A}$ is the intrafield component of $r_i$ and may be determined by equation (15):

$$r_{i,A} = r_i - r_{i,B}, \quad (15)$$

where $r_{i,B}$ is the interfield component of $r_i$, i.e., a vector from the wafer center to the center of the field where $r_i$ is located.

The process then continues to step 530 to determine the error of focus for each field by using formula $\Delta F = \langle F \rangle - F_N$, wherein $F_N$ is baseline focus.

In addition, image tilt may be determined from equation (14) above, which is expressed as rotation with respect to the x and y axes of the field, respectively. Image tilt describes a tilt that occurs in an image field when the best height is different from point to point in the image field. Adjusting image tilt provides a better quality of the resultant image.

After errors of focus and exposure dose for each field are determined, correction of focus, image tilt, and exposure dose may be performed for each field on a subsequent wafer. The correction is performed in the exposure tool by adjusting the focus and exposure dose settings in the exposure tool. For example, correction of focus by $-\Delta F$, correction of image tilt by $-R_x$ and $-R_y$, and correction of exposure dose by $-\Delta E$ may be performed by the exposure tool.

Figure 6:
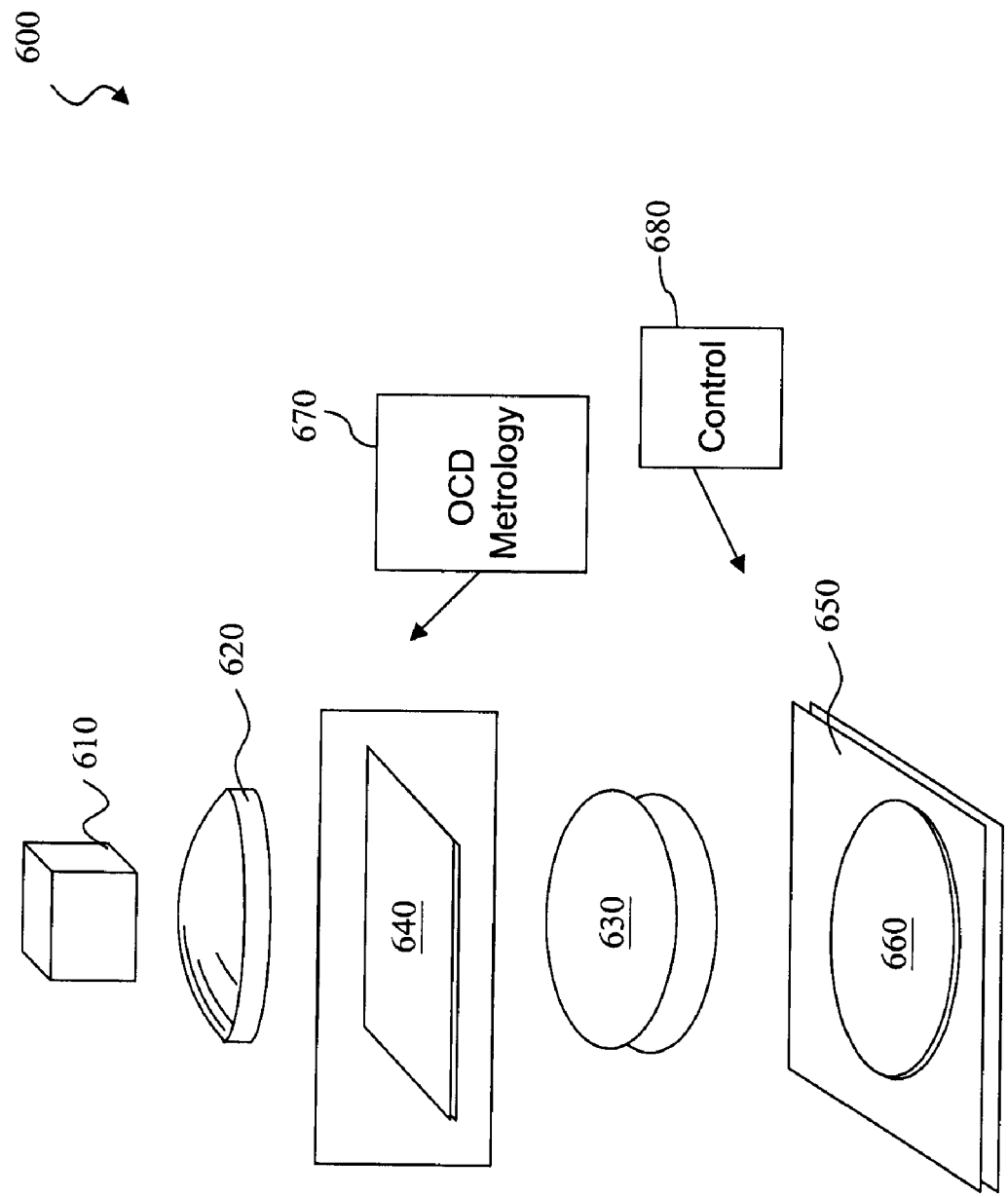
FIG. 6 is a schematic view of an exemplary embodiment of a system in which monitoring and control of focus and exposure dose for improving critical dimension uniformity may be implemented.

FIG. 6 illustrates a schematic view of an exemplary embodiment of a lithography system 600 performing lithography processing with exposure dose and focus monitoring and control to improve critical dimension uniformity, constructed according to aspects of the present disclosure.

The lithography apparatus 600 includes a radiation source 610 to provide radiation energy for exposure. The radiation source 610 may be a suitable light source such as an ultraviolet (UV), or deep ultra-violet (DUV) source. In various embodiments, the radiation source 610 may be, a mercury lamp having a wavelength of 365 nm (I-line); a Krypton Fluoride (KrF) excimer laser with wavelength of 248 nm; or an Argon Fluoride (ArF) excimer laser with a wavelength of 193 nm.

The lithography apparatus 600 includes an illumination module (e.g., a condenser) 620 having a single lens, or multiple lenses, and other lens components. For example, the illumination module 620 may include microlens arrays, shadow masks, or other structures designed to aid in directing radiation energy from the radiation source 610 onto a mask.

The lithography apparatus 600 also includes an imaging lens module 630. The imaging lens module 630 may have a single lens or a plurality of lens elements configured to project the radiation energy onto a substrate.

A mask 640 is utilized in the lithography apparatus 600 during a lithography patterning process and may be positioned between the illumination module 620 and the imaging lens module 630. The mask 640 includes a transparent substrate such as fused quartz ($SiO_2$) in one embodiment. The mask 640 further includes a pre-designed mask pattern formed on and/or in the substrate. The mask pattern may be designed according to integrated circuit features to be formed on a semiconductor substrate. In one embodiment, the mask pattern may include an absorption layer formed using a plurality of processes and materials, such as depositing a metal film made with chromium (Cr), iron oxide, or an inorganic film made with MoSi, ZrSiO, SiN, and/or TiN. The absorption layer is patterned to have one or more openings where radiation energy may travel through without being absorbed and have one or more absorption areas where the radiation energy may be completely or partially blocked thereby. In another embodiment, the mask pattern may include phase shift features formed above, on and/or at least partially in the substrate by etching thereof. The pattern layer may be a binary intensity mask (BIM or binary mask) including chrome areas and transparent quartz areas. In another embodiment, the mask pattern may be an alternating phase shift mask (AltPSM), employing alternating areas of chrome and about 180 degree-shifted quartz. In another embodiment, the mask pattern may be an attenuating phase shift mask (AttPSM), employing an attenuating feature having a phase shift relative to the transparent quartz area. Alternatively, the mask pattern may be a chromeless phase shift pattern. In another embodiment, the mask pattern may include a combination of binary features and various phase shift features. Additionally, the mask pattern may include various optical proximity correction (OPC) features designed and disposed approximate to integrated circuits features. The mask 140 may be held on a mask table (not shown) and operable to move in translational and rotational modes.

The system 600 includes a substrate stage 650 for holding a substrate 660 to be patterned and manipulating the substrate in transitional and/or rotational modes during a lithography patterning process. The substrate 660 may be a semiconductor wafer having silicon, germanium, diamond, or a compound semiconductor. The substrate 660 may alternatively include other materials such as glass for thin-film transistor liquid crystal display (TFT_LCD) devices or fused silicon/ calcium fluoride for photomask. The substrate 660 may include a plurality of layers formed thereon, each having patterned structures. The substrate 660 may include a material layer formed thereon and to be patterned. The substrate 660 is further coated with an imaging layer such as photoresist for lithography patterning process. An exemplary photoresist material includes chemical amplification photoresist (CAR).

The system 600 may further include a track unit (not shown) designed for resist processing, such as resist coating, baking and/or developing for examples. The track unit may have a standard interface so it can be built together and have proper connection and communication with the system.

The system 600 further includes a scatterometry-based optical critical dimension metrology (OCD) 670. The OCD is a sensitive optical technique for determining properties of surfaces and thin films. OCD combines non-contact optical technology with extremely powerful data analysis software to provide highly accurate measurement results for line width, height and sidewall angles. The metrology tool 670 may alternatively be other proper tool capable of measuring both resist CD and profile. The metrology tool 670 may be integral to the system 600 such that CD and profile (such as sidewall angle) of resist features on wafers processed within the system 600 can be monitored in-situ with efficiency.

The system 600 further includes a control module 680 combining hardware and software 680 designed, with the system 600, to provide functions and capability for monitoring resist CD and profile, extracting exposure dose and focus, and providing exposure dose and focus correction according to the method described above. In one embodiment, the control module 680, with combined hardware and software and further with in coordination with the system 600, enables a model-based focus and exposure energy monitoring technique. The control module 680 may be integral to the system 600 and the OCD metrology tool 670 or coupled thereto to have proper connection and communication therewith to achieve the same with efficiency.

The present disclosure provides a method and system for improving critical dimension uniformity through active compensation by an exposure tool such as the system 600, based on an effective focus and exposure dose determined from a critical dimension and a side-wide angle measured by scatterometry-based optical critical dimension (OCD) technology. Some advantages may present in various embodiments. For example, the present method monitoring both exposure dose and focus in a same procedure by measuring both CD and SWA. The manufacturing cost such as test mask cost and/or additional measurement cost are reduced or eliminated. The resist damage caused by SEM is eliminated since OCD is employed instead of SEM. In-line monitoring and control of exposure dose and focus for uniform critical dimension are achieved by utilizing the disclosed method and system.

In summary, aspects of the present disclosure provide a method and system for improving critical dimension uniformity. In one embodiment, the present disclosure provides a method for improving critical dimension uniformity of a substrate. The method includes exposing a plurality of mask patterns on a plurality of substrates at predetermined locations with common split conditions of focus ($\{F_j\}$) and exposure dose ($\{E_k\}$) for each of the substrates to form a first plurality of patterns on the first plurality of substrates. The method includes measuring critical dimension of the plurality of patterns at each of the predetermined locations for each of the plurality of substrates; averaging the critical dimension of the first plurality of patterns measured at each of the predetermined locations over the first plurality of substrates to form a perturbed critical dimension map; measuring a sidewall angle of the first plurality of patterns at each of the predetermined locations for each of the plurality of substrates; averaging the sidewall angle of the first plurality of patterns measured at each of the predetermined locations over the plurality of substrates to form a perturbed sidewall angle map; and providing the perturbed critical dimension map and the perturbed sidewall angle map to an exposure tool.

The method may further include exposing the plurality of mask patterns on a second plurality of substrates at the predetermined locations with same baseline conditions of focus and exposure dose to form a second plurality of patterns on the second plurality of substrates; measuring a critical dimension of the second plurality of patterns at each of the predetermined locations for each of the plurality of substrates; averaging the critical dimension of the second plurality of patterns measured at each of the predetermined locations over the second plurality of substrates to form a baseline critical dimension map; measuring a sidewall angle of the second plurality of patterns at each of the predetermined locations for each of the second plurality of substrates; averaging the sidewall angle of the second plurality of patterns measured at each of the predetermined locations over the second plurality of substrates to form a baseline sidewall angle map; and providing the baseline critical dimension map and the baseline sidewall angle map to the exposure tool.

The method may further include determining a corrected perturbed critical dimension map by subtracting critical dimension value of the baseline critical dimension map from critical dimension value of the perturbed critical dimension map at each of the predetermined locations; and determining a corrected perturbed sidewall angle map by subtracting sidewall angle value of the baseline sidewall angle map from sidewall angle value of the perturbed sidewall angle map at each of the predetermined locations.

The method may further include determining critical dimension (W) as a function of focus (F) and exposure dose (E) based on the corrected perturbed critical dimension map; and determining sidewall angle (U) as a function of focus (F) for each of the splits of exposure dose ($E_k$) based on the corrected perturbed sidewall angle map. The method may also include, for critical dimension value ($W_i$) and sidewall angle value ($U_i$) measured at each of predetermined locations ($r_i$) on a substrate, solving focus (F) to obtain a focus value $F_{i,k}$ by substituting the sidewall angle value ($U_i$) into the sidewall angle (U) as a function of focus (F) for each of the splits of exposure dose ($E_k$); fitting all the $\{E_k, F_{i,k}\}$ pairs in a first-order polynomial to obtain focus (F) as a function of exposure dose (E); solving exposure dose (E) to obtain an actual exposure dose value ($E_i$) by substituting the focus (F) as a function of exposure dose (E) and the critical dimension value ($W_i$) into the critical dimension (W) as a function of focus (F) and exposure dose (E); and solving focus (F) to obtain an actual focus value ($F_i$) by substituting the actual exposure dose value ($E_i$) into the focus (F) as a function of the exposure dose (E).

In this method, the critical dimension (W) as a function of focus (F) and exposure dose (E) is $W=(a_0+a_1E)(F-f_0)^2+g_0+g_1E$, where $a_0$, $a_1$, $d_0$, $d_1$, $f_0$, $g_0$, and $g_1$ may be constants. The sidewall angle as a function of focus (F) for each of the splits of exposure dose ($E_k$) is $U=b_{0,k}+b_{1,k}F+b_{2,k}F^2+b_{3,k}F^3$, wherein $b_{0,k}$, $b_{1,k}$, $b_{2,k}$, and $b_{3,k}$ may be constants.

In this method, the focus (F) as a function of exposure dose (E) may be $F=d_0+d_1E$. $d_0$ and $d_1$ are constants. The method may further include averaging all actual exposure dose values ($E_i$) within each field on the substrate to obtain an average intrafield exposure dose <E> for each field; calculating an error of exposure dose $\Delta E$ for each field based on a deviation of the average intrafield exposure dose <E> from an applied baseline exposure dose $E_N$; and calculating a correction of exposure dose as $-\Delta E$. In the method, the deviation of the average intrafield exposure dose from the applied baseline exposure dose may be expressed as <E>$-E_N$, wherein <E> is the average intrafield exposure dose, and wherein $E_N$ is the baseline exposure dose. The method may further include fitting all actual focus values ($F_i$) within each field on the substrate as a function of intrafield location vector ($r_A$) to obtain an intrafield focus $F=-R_yX_A+R_xy_A+$<F> for each field; calculating an error of focus $\Delta F$ for each field based on a deviation of the average intrafield focus <F> from the applied baseline focus $F_N$; calculating a correction of focus as $-\Delta F$; calculating a correction of image tilt as $-R_x$ and $-R_y$; and performing a correction of focus, image tilt, and exposure dose for each field on a subsequent substrate by implementing the correction of focus, the correction of image tilt, and the correction of exposure dose in the exposure tool. The deviation of the average intrafield focus <F> from the applied baseline focus $F_N$ may be <F>$-F_N$. The parameters $X_A$ and $Y_A$ may be variables for an intrafield location vector $r_{i,A}$. The intrafield location vector $r_{i,A}=(x_{i,A}, Y_{i,A})$ when expressed in Cartesian coordinates, $r_{i,A}$ may equal to $r_i-r_{i,B}$, wherein $r_{i,B}$ is a vector from the center of a substrate to the center of a field where $r_i$ is located.

The present disclosure also provides a system for improving critical dimension uniformity of a substrate. The system includes exposing means for exposing a plurality of mask patterns on a first plurality of substrates at predetermined locations with common split conditions of focus ($\{F_j\}$) and exposure dose ($\{E_k\}$) for each of the first plurality of substrates to form a plurality of perturbed wafers; measuring means for measuring critical dimension of the plurality of mask patterns at each of the predetermined locations for each of the plurality of perturbed wafers; averaging means for averaging the critical dimension measured at each of the predetermined locations over the plurality of perturbed wafers to form a perturbed critical dimension map; measuring means for measuring sidewall angle of the plurality of patterns at the predetermined locations for each of the plurality of perturbed wafers; averaging means for averaging the sidewall angle measured at each of the predetermined locations over the plurality of perturbed wafers to form a perturbed sidewall angle map; and providing means for providing the perturbed critical dimension map and the perturbed sidewall angle map to an exposure tool.

The system may further include exposing means for exposing the plurality of patterns on a second plurality of substrates at the predetermined locations with common baseline conditions of focus and exposure dose to form a plurality of baseline wafers; measuring means for measuring a critical dimension of the plurality of mask patterns at each of the predetermined locations for each of the plurality of baseline wafers; averaging means for averaging the critical dimension measured at each of the predetermined locations over the plurality of baseline wafers to form a baseline critical dimension map; measuring means for measuring a sidewall angle of the plurality of mask patterns at each of the predetermined locations for each of the plurality of baseline wafers; averaging means for averaging the sidewall angle measured at each of the predetermined locations over the plurality of baseline wafers to form a baseline sidewall angle map; and providing means for providing the baseline critical dimension map and the baseline sidewall angle map to an exposure tool. The system may further include determining means for determining a corrected perturbed critical dimension map by subtracting critical dimension value of the baseline critical dimension map from critical dimension value of the perturbed critical dimension map at each of the predetermined locations; and determining means for determining a corrected perturbed sidewall angle map by subtracting sidewall angle value of the baseline sidewall angle map from sidewall angle value of the perturbed sidewall angle map at each of the predetermined locations.

The system may further include determining means for determining critical dimension (W) as a function of focus (F) and exposure dose (E) based on the corrected perturbed critical dimension map; and determining means for determining sidewall angle (U) as a function of focus (F) for each of the splits of exposure dose ($E_k$) based on the corrected perturbed sidewall angle map. The system may further include: for critical dimension value ($W_i$) and sidewall angle value ($U_i$) measured at each of predetermined locations ($r_i$) on a substrate, solving means for solving focus (F) to obtain a focus value $F_{i,k}$ by substituting the sidewall angle value ($U_i$) into the sidewall angle (U) as a function of focus (F) for each of the splits of exposure dose ($E_k$); fitting means for fitting all the $\{E_k, F_{i,k}\}$ pairs in a first-order polynomial to obtain focus (F) as a function of exposure dose (E); solving means for solving exposure dose (E) to obtain an actual exposure dose value ($E_i$) by substituting the focus (F) as a function of exposure dose (E) and the critical dimension value ($W_i$) into the critical dimension (W) as a function of focus (F) and exposure dose (E); and solving means for solving focus (F) to obtain an actual focus value ($F_i$) by substituting the actual exposure dose value ($E_i$) into the focus (F) as a function of the exposure dose (E). The system may further include averaging means for averaging all actual exposure dose values ($E_i$) within each field on the substrate to obtain an average intrafield exposure dose <E> for each field; calculating means for calculating an error of exposure dose $\Delta E$ for each field based on a deviation of the average intrafield exposure dose <E> from the baseline exposure dose ($E_N$); and calculating means for calculating a correction of exposure dose as $-\Delta E$ for each field. The system may further include fitting means for fitting all the actual focus values ($F_i$) within each field on the substrate as a function of intrafield location vector ($r_A$) to obtain an intrafield focus F for each field $F=-R_yX_A+R_xy_A+$<F>; calculating means for calculating an error of focus $\Delta F$ for each field based on a deviation of the average intrafield focus <F> from the baseline focus $F_N$; calculating means for calculating a correction of focus for each field as $-\Delta F$; calculating means for calculating a correction of image tilt for each field as $-R_x$ and $-R_y$; and performing means for performing a correction of focus, image tilt, and exposure dose for each field on a subsequent substrate by implementing the correction of focus, the correction image tilt, and the correction of exposure dose in an exposure tool.

Aspects of the present disclosure are best understood from the following above description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

Although only a few exemplary embodiments of this invention have been described in detail above, those skilled in the art will readily appreciate that many modifications are possible in the exemplary embodiments without materially departing from the novel teachings and advantages of this invention. It is understood that various different combinations of the above-listed steps can be used in various sequences or in parallel, and there is no particular step that is critical or required. Also, features illustrated and discussed above with respect to some embodiments can be combined with features illustrated and discussed above with respect to other embodiments. Accordingly, all such modifications are intended to be included within the scope of this invention.

What is claimed is:

1. A method for improving substrate critical dimension uniformity, the method comprising:
   exposing a plurality of mask patterns on a first plurality of substrates at predetermined locations with common split conditions of focus ($\{F_j\}$) and exposure dose ($\{E_k\}$) for each of the first plurality of substrates to form a plurality of perturbed wafers;
   measuring a critical dimension of the plurality of mask patterns at each of the predetermined locations for each of the plurality of perturbed wafers;
   averaging the critical dimension measured at each of the predetermined locations over the plurality of perturbed wafers to form a perturbed critical dimension map;
   measuring a sidewall angle of the plurality of mask patterns at each of the predetermined locations for each of the plurality of perturbed wafers;
   averaging the sidewall angle measured at each of the predetermined locations over the plurality of perturbed wafers to form a perturbed sidewall angle map; and
   providing the perturbed critical dimension map and the perturbed sidewall angle map to an exposure tool.

2. The method of claim 1, further comprising:
   exposing the plurality of mask patterns on a second plurality of substrates at the predetermined locations with same baseline conditions of focus and exposure dose to form a plurality of baseline wafers;
   measuring a critical dimension of the plurality of mask patterns at each of the predetermined locations for each of the plurality of baseline wafers;
   averaging the critical dimension measured at each of the predetermined locations over the plurality of baseline wafers to form a baseline critical dimension map;
   measuring a sidewall angle of the plurality of mask patterns at each of the predetermined locations for each of the plurality of baseline wafers;
   averaging the sidewall angle measured at each of the predetermined locations over the plurality of baseline wafers to form a baseline sidewall angle map; and
   providing the baseline critical dimension map and the baseline sidewall angle map to the exposure tool.

3. The method of claim 2, further comprising:
   determining a corrected perturbed critical dimension map by subtracting a critical dimension value of the baseline critical dimension map from a critical dimension value of the perturbed critical dimension map at each of the predetermined locations; and
   determining a corrected perturbed sidewall angle map by subtracting a sidewall angle value of the baseline sidewall angle map from a sidewall angle value of the perturbed sidewall angle map at each of the predetermined locations.

4. The method of claim 3, further comprising:
   determining critical dimension (W) as a function of focus (F) and exposure dose (E) based on the corrected perturbed critical dimension map; and
   determining sidewall angle (U) as a function of focus (F) for each of the splits of exposure dose ($E_k$) based on the corrected perturbed sidewall angle map.

5. The method of claim 4, wherein the critical dimension (W) as a function of focus (F) and exposure dose (E) is $W=(a_0+a_1E)(F-f_0)^2+g_0+g_1E$, where $a_0$, $a_1$, $d_0$, $d_1$, $f_0$, $g_0$, and $g_1$ are constants.

6. The method of claim 4, wherein the sidewall angle as a function of focus (F) for each of the splits of exposure dose ($E_k$) is $U=b_{0,k}+b_{1,k}F+b_{2,k}F^2+b_{3,k}F^3$, wherein $b_{0,k}$, $b_{1,k}$, $b_{2,k}$, and $b_{3,k}$ are constants.

7. The method of claim 4, further comprising:
   for critical dimension value ($W_i$) and sidewall angle value ($U_i$) measured at each of the predetermined locations ($r_i$) on a substrate, solving focus (F) to obtain a focus value $F_{i,k}$ by substituting the sidewall angle value ($U_i$) into the sidewall angle (U) as a function of focus (F) for each of the splits of exposure dose ($E_k$);
   fitting all the $\{E_k, F_{i,k}\}$ pairs in a first-order polynomial to obtain focus (F) as a function of exposure dose (E);
   solving exposure dose (E) to obtain an actual exposure dose value ($E_i$) by substituting the focus (F) as a function of exposure dose (E) and the critical dimension value ($W_i$) into the critical dimension (W) as a function of focus (F) and exposure dose (E); and
   solving focus (F) to obtain an actual focus value ($F_i$) by substituting the actual exposure dose value ($E_i$) into the focus (F) as a function of the exposure dose (E).

8. The method of claim 7, wherein the focus (F) as a function of exposure dose (E) is $F=d_0+d_1E$, wherein $d_0$ and $d_1$ are constants.

9. The method of claim 7, further comprising:
   averaging all actual exposure dose values ($E_i$) within each field on the substrate to obtain an average intrafield exposure dose <E> for each field;
   calculating an error of exposure dose $\Delta E$ for each field based on a deviation of the average intrafield exposure dose <E> from an applied baseline exposure dose $E_N$; and
   calculating a correction of exposure dose as $-\Delta E$.

10. The method of claim 9, wherein the deviation of the average intrafield exposure dose from the applied baseline exposure dose is expressed as <E>$-E_N$.

11. The method of claim 9, further comprising:
    fitting all actual focus values ($F_i$) within each field on the substrate as a function of intrafield location vector ($r_A$) to obtain an intrafield focus $F=-R_yx_A+R_xy_A+$<F> for each field;
    calculating an error of focus $\Delta F$ for each field based on a deviation of the average intrafield focus <F> from an applied baseline focus $F_N$;
    calculating a correction of focus as $-\Delta F$;
    calculating a correction of image tilt as $-R_x$ and $-R_y$; and
    performing a correction of focus, image tilt, and exposure dose for each field on a subsequent substrate by implementing the correction of focus, the correction of image tilt, and the correction of exposure dose in the exposure tool.

12. The method of claim 11, wherein the deviation of the average intrafield focus <F> from the applied baseline focus $F_N$ is <F>−$F_N$.

13. The method of claim 11, wherein $X_A$ and $Y_A$ are variables for an intrafield location vector $r_{i,A}$.

14. The method of claim 13, wherein the intrafield location vector $r_{i,A}=(x_{i,A}, y_{i,A})$ when expressed in Cartesian coordinates, wherein $r_{i,A}=r_i-r_{i,B}$, wherein $r_{i,B}$ is a vector from the center of a substrate to the center of a field where $r_i$ is located.

15. A system for improving substrate critical dimension uniformity comprising:
 exposing means for exposing a plurality of mask patterns on a first plurality of substrates at predetermined locations with common splits of focus ($\{F_j\}$) and exposure dose ($\{E_k\}$) for each of the first plurality of substrates to form a plurality of perturbed wafers;
 measuring means for measuring a critical dimension of the plurality of mask patterns at each of the predetermined locations for each of the plurality of perturbed wafers;
 averaging means for averaging the critical dimension measured at each of the predetermined locations over the plurality of perturbed wafers to form a perturbed critical dimension map;
 measuring means for measuring a sidewall angle of the plurality of mask patterns at each of the predetermined locations for each of the plurality of perturbed wafers;
 averaging means for averaging the sidewall angle measured at each of the predetermined locations over the plurality of perturbed wafers to form a perturbed sidewall angle map; and
 providing means for providing the perturbed critical dimension map and the perturbed sidewall angle map to an exposure tool.

16. The system of claim 15, further comprising:
 exposing means for exposing the plurality of mask patterns on a second plurality of substrates at the predetermined locations with common baseline conditions of focus and exposure dose to form a plurality of baseline wafers;
 measuring means for measuring a critical dimension of the plurality of mask patterns at each of the predetermined locations for each of the plurality of baseline wafers;
 averaging means for averaging the critical dimension measured at each of the predetermined locations over the plurality of baseline wafers to form a baseline critical dimension map;
 measuring means for measuring a sidewall angle of the plurality of mask patterns at each of the predetermined locations for each of the plurality of baseline wafers;
 averaging means for averaging the sidewall angle measured at each of the predetermined locations over the plurality of baseline wafers to form a baseline sidewall angle map; and
 providing means for providing the baseline critical dimension map and the baseline sidewall angle map to the exposure tool.

17. The system of claim 16, further comprising:
 determining means for determining a corrected perturbed critical dimension map by subtracting a critical dimension value of the baseline critical dimension map from a critical dimension value of the perturbed critical dimension map at each of the predetermined locations; and
 determining means for determining a corrected perturbed sidewall angle map by subtracting a sidewall angle value of the baseline sidewall angle map from a sidewall angle value of the perturbed sidewall angle map at each of the predetermined locations.

18. The system of claim 17, further comprising:
 determining means for determining critical dimension (W) as a function of focus (F) and exposure dose (E) based on the corrected perturbed critical dimension map; and
 determining means for determining sidewall angle (U) as a function of focus (F) for each of the splits of exposure dose ($E_k$) based on the corrected perturbed sidewall angle map.

19. The system of claim 18, further comprising:
 for critical dimension value ($W_i$) and sidewall angle value ($U_i$) measured at each of predetermined locations ($r_i$) on a substrate, solving means for solving focus (F) to obtain a focus value $F_{i,k}$ by substituting the sidewall angle value ($U_i$) into the sidewall angle (U) as a function of focus (F) for each of the splits of exposure dose ($E_k$);
 fitting means for fitting all the $\{E_k, F_{i,k}\}$ pairs in a first-order polynomial to obtain focus (F) as a function of exposure dose (E);
 solving means for solving exposure dose (E) to obtain an actual exposure dose value ($E_i$) by substituting the focus (F) as a function of exposure dose (E) and the critical dimension value ($W_i$) into the critical dimension (W) as a function of focus (F) and exposure dose (E); and
 solving means for solving focus (F) to obtain an actual focus value ($F_i$) by substituting the actual exposure dose value ($E_i$) into the focus (F) as a function of the exposure dose (E).

20. The system of claim 19, further comprising:
 averaging means for averaging all actual exposure dose values ($E_i$) within each field on the substrate to obtain an average intrafield exposure dose <E> for each field;
 calculating means for calculating an error of exposure dose ΔE for each field based on a deviation of the average intrafield exposure dose <E> from the baseline exposure dose ($E_N$); and
 calculating means for calculating a correction of exposure dose as −ΔE for each field.

21. The system of claim 20, further comprising:
 fitting means for fitting all the actual focus values ($F_i$) within each field on the substrate as a function of intrafield location vector ($r_A$) to obtain an intrafield focus F for each field F=−$R_y x_A$+$R_x y_A$+<F>;
 calculating means for calculating an error of focus ΔF for each field based on a deviation of the average intrafield focus <F> from the baseline focus $F_N$;
 calculating means for calculating a correction of focus for each field as −ΔF;
 calculating means for calculating a correction of image tilt for each field as −$R_x$ and −$R_y$; and
 performing means for performing a correction of focus, image tilt, and exposure dose for each field on a subsequent substrate by implementing the correction of focus, the correction image tilt, and the correction of exposure dose in an exposure tool.

* * * * *